(12) United States Patent
Park et al.

(10) Patent No.: US 8,268,699 B2
(45) Date of Patent: Sep. 18, 2012

(54) WAFER STRUCTURES AND WAFER BONDING METHODS

(75) Inventors: Sang-Joon Park, Seoul (KR); Kyoung-Kook Kim, Suwon-si (KR); Yu-Sik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 637 days.

(21) Appl. No.: 12/384,617

(22) Filed: Apr. 7, 2009

(65) Prior Publication Data
US 2009/0252939 A1 Oct. 8, 2009

(30) Foreign Application Priority Data
Apr. 7, 2008 (KR) .................. 10-2008-0032193

(51) Int. Cl.
*H01L 21/30* (2006.01)
(52) U.S. Cl. .................. 438/455; 438/458; 438/464

(58) Field of Classification Search .................. 438/113, 438/114, 118, 455, 458, 459, 464
See application file for complete search history.

(56) References Cited

U.S. PATENT DOCUMENTS

| | | | |
|---|---|---|---|
| 5,349,207 A | 9/1994 | Malhi | |
| 6,248,646 B1 | 6/2001 | Okojie | |
| 6,949,164 B2 * | 9/2005 | Sabia | 156/314 |
| 6,960,490 B2 * | 11/2005 | Cunningham | 438/107 |

FOREIGN PATENT DOCUMENTS
JP 6-232236 8/1994
* cited by examiner

*Primary Examiner* — Kevin M Picardat
(74) *Attorney, Agent, or Firm* — Onello & Mello, LLP

(57) ABSTRACT

Wafer structures and wafer bonding methods are provided. In some embodiments, a wafer bonding method includes providing a conductive wafer and a plurality of insulating wafers, the conductive wafer being larger than the insulating wafers; performing a pre-treatment operation on the conductive wafer, the insulating wafers, or both; and directly bonding the insulating wafers to the conductive wafer.

11 Claims, 6 Drawing Sheets

WAFER STRUCTURES AND WAFER BONDING METHODS

CROSS-REFERENCE TO RELATED APPLICATION

This application claims priority to Korean Patent Application No. 10-2008-0032193, filed on Apr. 7, 2008 in the Korean Intellectual Property Office, the disclosure of which is incorporated herein by reference in its entirety.

FIELD OF THE INVENTION

The present invention relates to wafer structures and wafer bonding methods.

BACKGROUND

Small wafers having a diameter of, for example, 6 inches or less, have been widely used to manufacture light-emitting devices, such as light-emitting diodes (LEDs) or laser diodes (LDs), since it can be difficult to manufacture light-emitting devices using wafers having a diameter more than 6 inches. However, the use of small wafers may increase the manufacturing cost of light-emitting devices.

SUMMARY OF THE INVENTION

Aspects of the present invention provide wafer bonding methods.

Aspects of the present invention also provide wafer structures obtained by wafer bonding methods.

However, the aspects, features and advantages of the present invention are not restricted to the ones set forth herein. The above and other aspects, features and advantages of the present invention will become more apparent to one of ordinary skill in the art to which the present invention pertains by referencing a detailed description of embodiments of the present invention given below.

According to an aspect of the present invention, there is provided a wafer bonding method including: providing a conductive wafer and a plurality of insulating wafers, the conductive wafer being larger than the insulating wafers; performing a pre-treatment operation on the conductive wafer, the insulating wafers, or both; and directly bonding the insulating wafers to the conductive wafer.

According to another aspect of the present invention, there is provided a wafer bonding method including: providing a conductive wafer and a plurality of insulating wafers, the conductive wafer being larger than the insulating wafers; forming dangling bonds on a bonding surface of the conductive wafer, bonding surfaces of the insulating wafers, or both; performing a pre-treatment operation on the conductive wafer, the insulating wafers, or both; and directly bonding the insulating wafers to the conductive wafer, the bonding surface of the conductive wafer facing the bonding surfaces of the insulating wafers.

According to another aspect of the present invention, there is provided a wafer structure including: a conductive wafer having a first size; and a plurality of insulating wafers having a second size and directly bonded onto the conductive wafer, wherein the first size is greater than the second size.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF EXEMPLARY EMBODIMENTS

Figure 1:
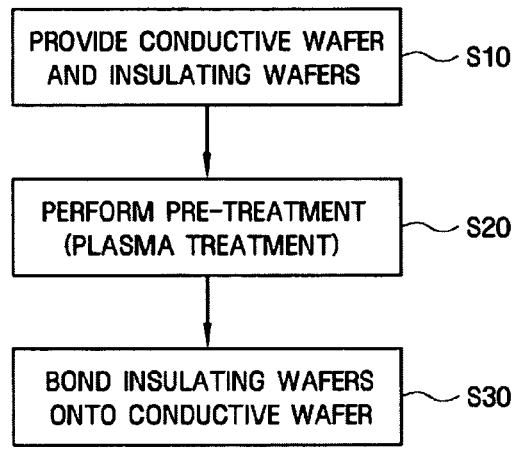
FIG. 1 illustrates a flowchart of a wafer bonding method according to an exemplary embodiment of the present invention.

Embodiments of the present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as shown in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on the "upper" side of the other elements. Similarly, if the device in one of the figures is turned over, elements described as "below" or "beneath" other elements would then be oriented "above" or "over" the other elements. Therefore, the exemplary terms "below" and "beneath" can, therefore, encompass both an orientation of above and below.

Wafer bonding methods according to exemplary embodiments of the present invention are classified as direct wafer bonding (DWB), which is characterized by bonding two or more wafers without the use of an adhesive.

Figure 4:
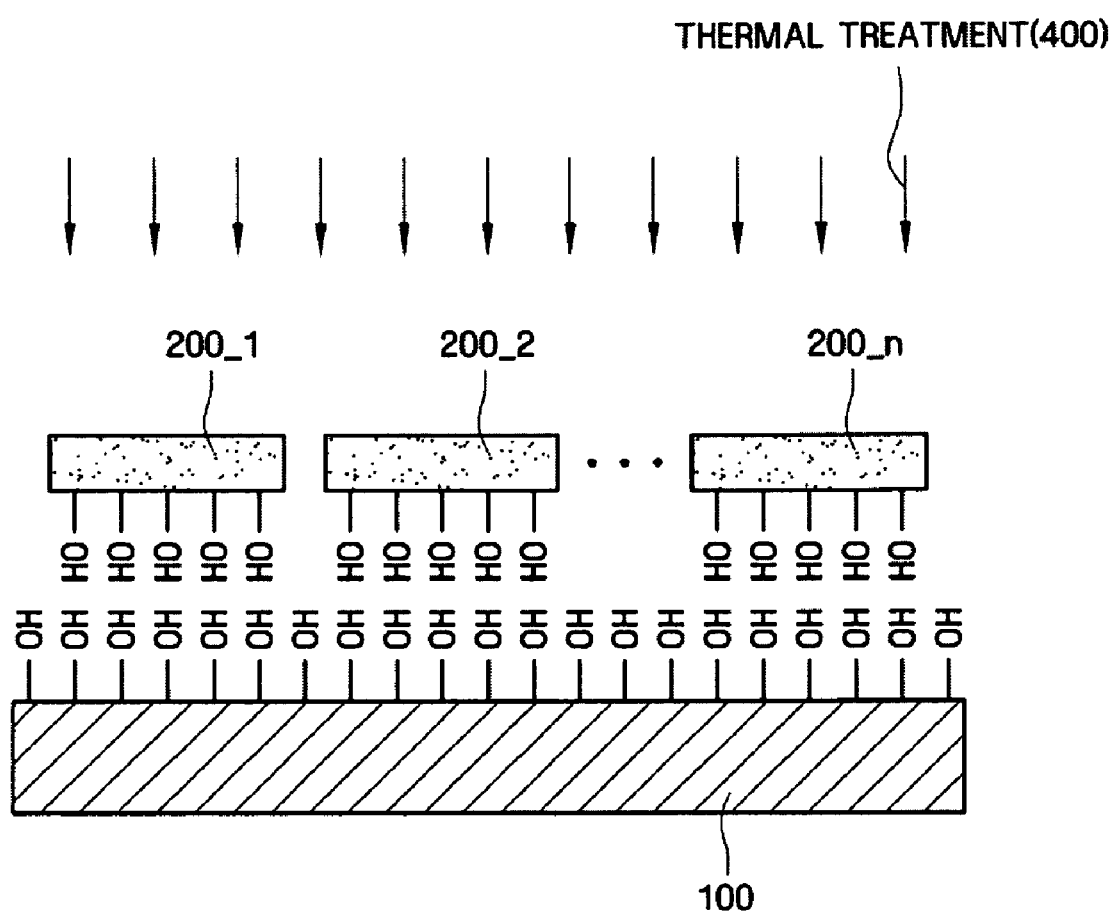
Figure 5:
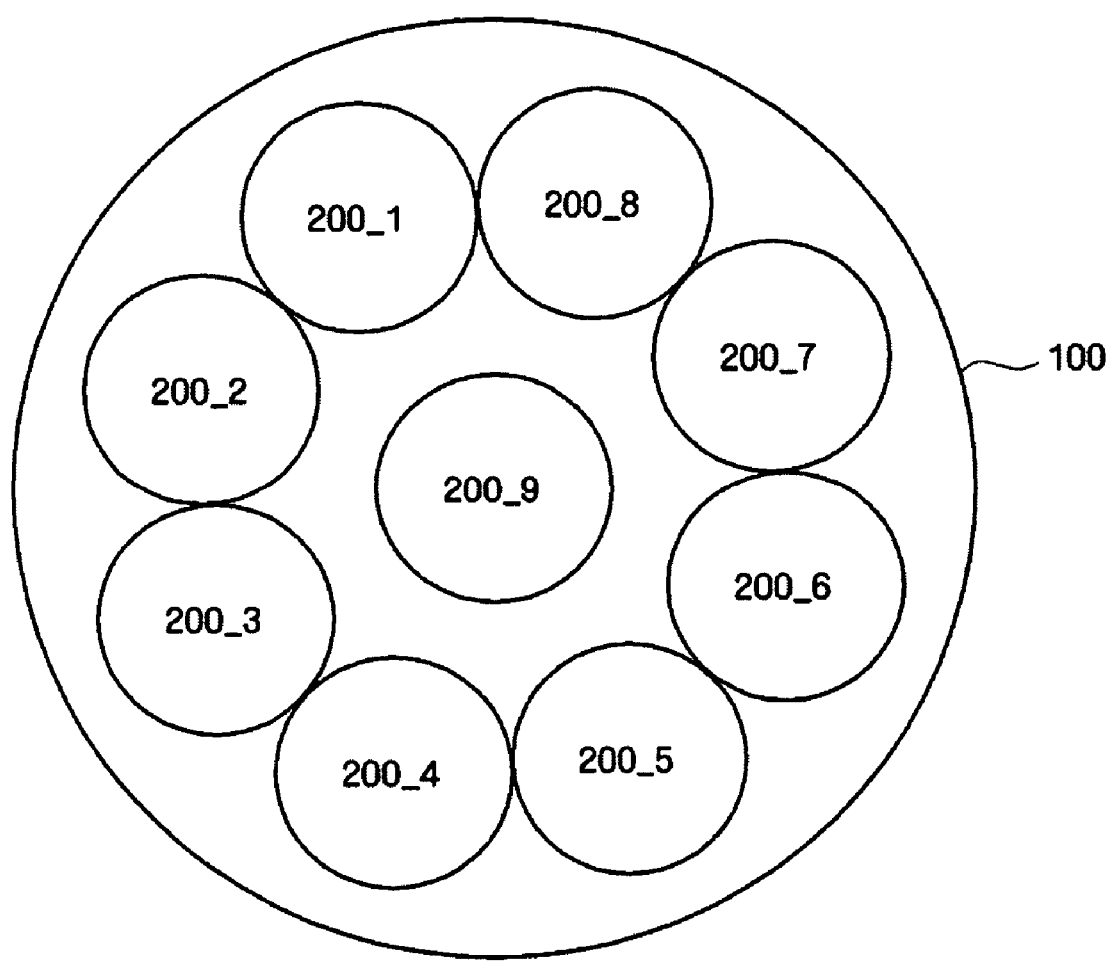
Figure 6:
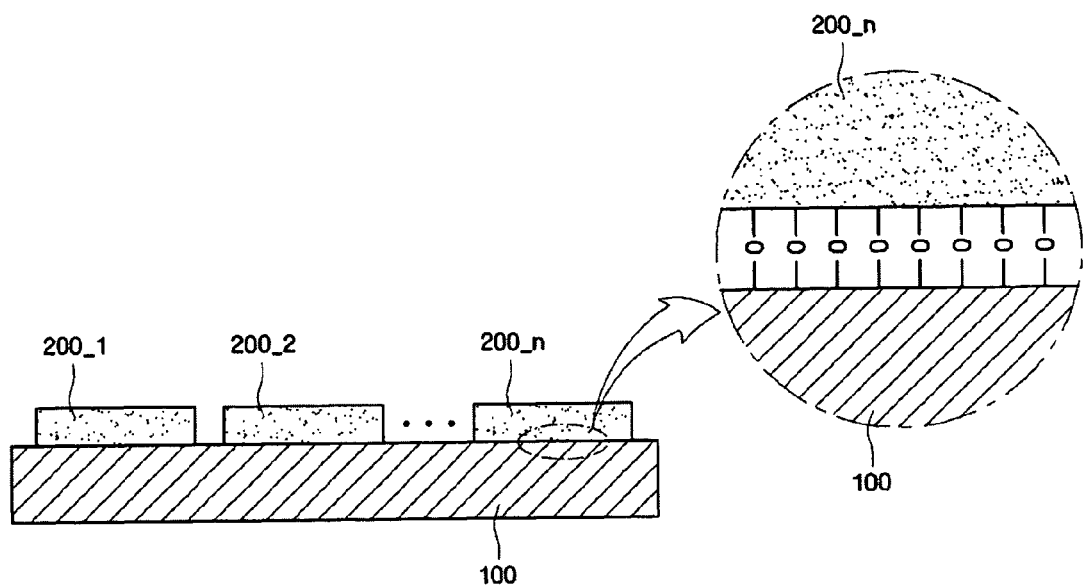
FIG. 6 illustrates a cross-sectional view of a wafer structure obtained by the wafer bonding method shown in FIG. 1.

FIG. 1 illustrates a flowchart of a wafer bonding method according to an exemplary embodiment of the present invention, FIGS. 2 through 5 illustrate diagrams for explaining the wafer bonding method shown in FIG. 1, and FIG. 6 illustrates a diagram of a wafer structure obtained by the wafer bonding method shown in FIG. 1.

Figure 2:
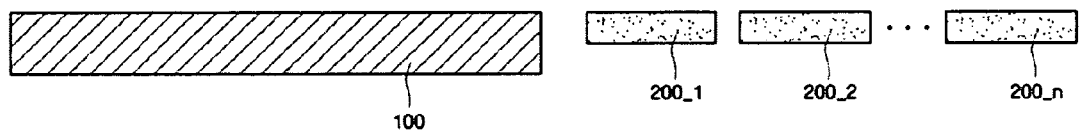
FIGS. 2 through 5 illustrate cross-sectional diagrams for explaining the wafer bonding method shown in FIG. 1.

Referring to FIGS. 1 and 2, a conductive wafer 100 and a plurality of insulating wafers 200_1 through 200_$n$ are provided (S10).

The conductive wafer 100 may be larger than the insulating wafers 200_1 through 200_$n$. Thus, if the conductive wafer 100 is laid over the insulating wafers 200_1 through 200_$n$, the insulating wafers 200_1 through 200_$n$ may be hidden from view by the conductive wafer 100. If the conductive wafer 100 and the insulating wafers 200_1 through 200_$n$ are all circular, the diameter of the conductive wafer 100 may be greater than the combined diameter of the insulating wafers 200_1 through 200_$n$. For example, the conductive wafer 100 may have a diameter of 6 inches (about 150 mm) or more, and the insulating wafers 200_1 through 200_$n$ may have a diameter of 6 inches or less. If the conductive wafer 100 and the insulating wafers 200_1 through 200_$n$ are all rectangular, the diagonal length of the conductive wafer 100 may be greater than the diagonal length of the insulating wafers 200_1 through 200_$n$.

The conductive wafer 100 may include silicon (Si), strained silicon, a silicon alloy, silicon-on-insulator (SOI), silicon carbide (SiC), silicon germanium (SiGe), silicon germanium carbide (SiGeC), germanium (Ge), a germanium alloy, gallium arsenide (GaAs), indium arsenide (InAs), a III-V semiconductor, a II-VI semiconductor or a combination or stack thereof, but the present invention is not restricted thereto.

The insulating wafers 200_1 through 200_$n$ may include sapphire ($Al_2O_3$), aluminum nitride, boron nitride, silicon oxide, silicon nitride, beryllium nitride, quartz or a combination or stack thereof, but the present invention is not restricted thereto.

In the exemplary embodiment shown in FIGS. 1 through 6, the conductive wafer 100 is a silicon wafer, and the insulating wafers 200_1 through 200_$n$ are sapphire wafers.

In some embodiments, to properly bond the conductive wafer 100 and the insulating wafers 200_1 through 200_$n$, the bonding surfaces of the conductive wafer 100 and the insulating wafers 200_1 through 200_$n$ are substantially flat and smooth. It can be difficult to properly bond the conductive wafer 100 and the insulating wafers 200_1 through 200_$n$ if the bonding surfaces of the conductive wafer 100 and the insulating wafers 200_1 through 200_$n$ are uneven and rough. That is, it may be appropriate to control the total thickness variation of the conductive wafer 100 and the insulating wafers 200_1 through 200_$n$. For example, an 8-inch wafer may be controlled to have a total thickness variation of 6 μm or less, and a 2-inch wafer may be controlled to have a total thickness variation of 1.5 μm.

Either the bonding surface of the conductive wafer 100 or the bonding surfaces of the insulating wafers 200_1 through 200_$n$ may be polished. For example, the surface roughness of the conductive wafer 100 and the insulating wafers 200_1 through 200_$n$ may be appropriately adjusted in units of angstroms (Å) by using, for example, chemical mechanical polishing (CMP). The bonding surfaces of the conductive wafer 100 and the insulating wafers 200_1 through 200_$n$ may have a surface roughness of 1 nm or less when measured by an atomic force microscope (AFM). The bonding surfaces of the conductive wafer 100 and the insulating wafers 200_1 through 200_$n$ may be mirror-polished.

In addition, in some embodiments, the bonding surfaces of the conductive wafer 100 and the insulating wafers 200_1 through 200_$n$ are clean. Therefore, the bonding surfaces of the conductive wafer 100 and the insulating wafers 200_1 through 200_$n$ may be properly washed, if necessary, because impurities (such as particles or dust) on the bonding surfaces of the conductive wafer 100 and the insulating wafers 200_1 through 200_$n$ may become contamination sources. Impurities between the conductive wafer 100 and the insulating wafers 200_1 through 200_$n$ may weaken the bonding energy between the conductive wafer 100 and the insulating wafers 200_1 through 200_$n$. The weaker the bonding energy between the conductive wafer 100 and the insulating wafers 200_1 through 200_$n$, the more likely the conductive wafer 100 and the insulating wafers 200_1 through 200_$n$ are to detach from each other.

Figure 3:
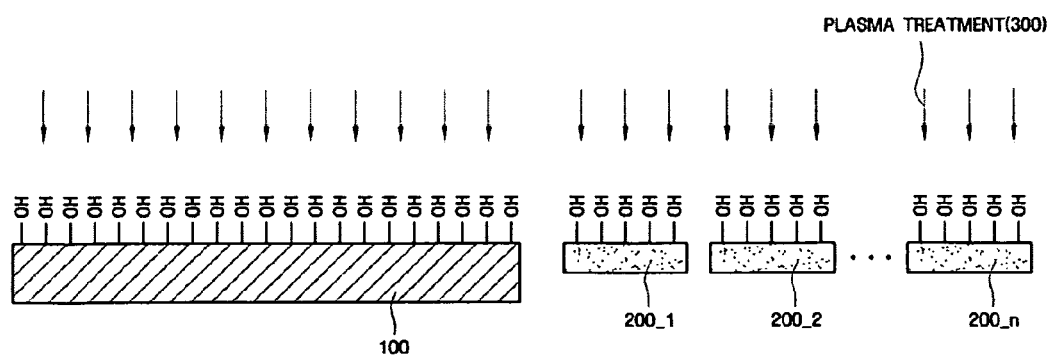

Referring to FIGS. 1 and 3, a pre-treatment operation is performed on the conductive wafer 100, the insulating wafers 200_1 through 200_$n$, or both (S20).

More specifically, referring to FIG. 3, the pre-treatment operation may be performed on the conductive wafer 100, the insulating wafers 200_1 through 200_$n$, or both.

The pre-treatment operation may be a plasma treatment operation 300. Since the plasma treatment operation 300 can be performed at low temperatures, the plasma treatment operation 300 may cause low stress to the conductive wafer 100 and the insulating wafers 200_1 through 200_$n$.

The plasma treatment operation 300 may be performed using at least one of $O_2$, $NH_3$, $SF_6$, Ar, $Cl_2$, $CHF_3$, and $H_2O$, but the present invention is not restricted to these materials.

As a result of the plasma treatment operation 300, the bonding surfaces of the conductive wafer 100 and the insulating wafers 200_1 through 200_$n$ may be activated. That is, as a result of the plasma treatment operation 300, the bonding surfaces of the conductive wafer 100 and the insulating wafers 200_1 through 200_$n$ may become more suitable for being bonded to one another.

As a result of the plasma treatment operation 300, dangling bonds may be formed on the bonding surfaces of the conductive wafer 100 and the insulating wafers 200_1 through 200_$n$. The dangling bonds may be hydrophilic or hydrophobic dangling bonds. For example, if the conductive wafer 100 is a silicon wafer and the insulating wafers 200_1 through 200_$n$ are sapphire wafers, hydrophilic dangling bonds '—OH' may be formed not only on the bonding surface of the conductive wafer 100 but also on the bonding surfaces of the insulating wafers 200_1 through 200_n.

Referring to FIGS. 1, 4 and 6, the insulating wafers 200_1 through 200_n are bonded onto the conductive wafer 100 (S30).

More specifically, referring to FIG. 4, the insulating wafers 200_1 through 200_n are laid over the conductive wafer 100 so that the bonding surfaces of the insulating wafers 200_1 through 200_n face the bonding surface of the conductive wafer 100. Then, the insulating wafers 200_1 through 200_n may be spontaneously attached onto the conductive wafer 100 due to Van der Waal's forces between the dangling bonds on the bonding surface of the conductive wafer 100 and the dangling bonds on the bonding surfaces of the insulating wafers 200_1 through 200_n.

Referring to FIG. 5, nine two-inch insulating wafers 200_1 through 200_9 may be laid over an eight-inch conductive wafer 100. The number of insulating wafers 200_1 through 200_n laid over the conductive wafer 100 may be determined by the size of the conductive wafer 100 and the size of the insulating wafers 200_1 through 200_n.

Thereafter, a thermal treatment operation 400 is performed on the conductive wafer 100 and the insulating wafers 200_1 through 200_n. As a result of the thermal treatment operation 400, the conductive wafer 100 and the insulating wafers 200_1 through 200_n may be coupled to one another through covalent bonding. More specifically, if the conductive wafer 100 is a silicon wafer and the insulating wafers 200_1 through 200_n are sapphire wafers, the conductive wafer 100 and the insulating wafers 200_1 through 200_n may be coupled to one another through oxygen covalent bonding, as indicated by the following reaction:

Si—OH+HO—Al$_2$O$_3$ ⇌ Si—O—Al$_2$O$_3$+H$_2$O.

The thermal treatment operation 400 may be performed in a temperature range of from about 25° C. (i.e., room temperature) to about 400° C.

It is possible to increase the bonding energy between the conductive wafer 100 and the insulating wafers 200_1 through 200_n by performing the thermal treatment operation 400 at high temperatures. However, if the thermal treatment operation 400 is performed at too high a temperature, the conductive wafer 100 and the insulating wafers 200_1 through 200_n may bend or crack. Therefore, the thermal treatment operation 400 may be performed at lower temperatures, for example, at a temperature of about 25-400° C. However, the present invention is not restricted to these temperatures. That is, the temperature at which the thermal treatment operation 400 is to be performed may be altered according to various processing conditions.

In some embodiments, the longer the duration of the thermal treatment operation 400, the higher the bonding energy between the conductive wafer 100 and the insulating wafers 200_1 through 200_n becomes. However, if the thermal treatment operation 400 is performed for more than a selected amount of time, all the dangling bonds, (e.g., dangling '—OH' bonds) on the bonding surfaces of the conductive wafer may be consumed for oxygen covalent bonding, and thus, the bonding energy between the conductive wafer 100 and the insulating wafers 200_1 through 200_n may not increase any more. The duration of the thermal treatment operation 400 may be appropriately altered, if necessary.

A wafer structure obtained by the wafer bonding method shown in FIG. 1 will hereinafter be described in detail with reference to FIG. 6.

Referring to FIG. 6, a wafer structure obtained by the wafer bonding method shown in FIG. 1 may include a conductive wafer 100 and a plurality of insulating wafers 200_1 through 200_n directly bonded to the conductive wafer. The conductive wafer 100 may be larger than the insulating wafers 200_1 through 200_n. Even though no adhesive is used to bond the conductive wafer 100 and the insulating wafers 200_1 through 200_n, the conductive wafer 100 and the insulating wafers 200_1 through 200_n are firmly coupled to one another through covalent bonding (e.g., oxygen covalent bonding), which is deemed one of the most effective bonding methods. Thus, the conductive wafer 100 and the insulating wafers 200_1 through 200_n can be prevented from being easily detached from one another.

By using the wafer bonding method shown in FIG. 1, it is possible to bond a plurality of small insulating wafers to a large conductive wafer by using large manufacturing equipment appropriate for handling large conductive wafers without requiring small manufacturing equipment appropriate for handling small insulating wafers. In addition, it is possible to improve throughput by fabricating a considerable number of small insulating wafers at the same time. Therefore, it is possible to reduce the cost of products fabricated using small insulating wafers.

Figure 7:
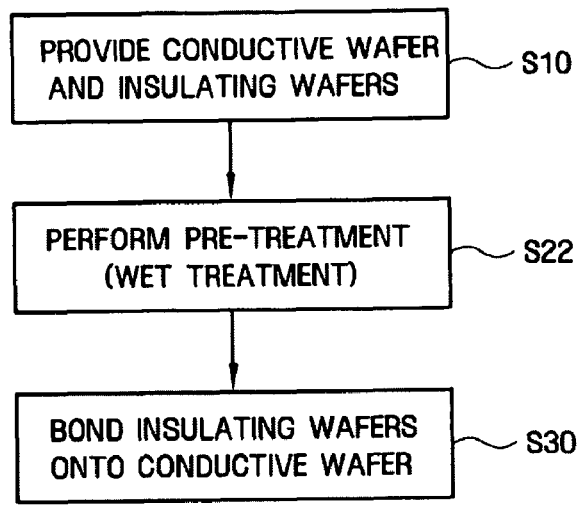
FIG. 7 illustrates a flowchart of a wafer bonding method according to another exemplary embodiment of the present invention.

FIG. 7 illustrates a flowchart of a wafer bonding method according to another exemplary embodiment of the present invention. In the wafer bonding method shown in FIG. 7, unlike in the wafer bonding method shown in FIG. 1, a wet treatment operation is performed as pre-treatment (S22).

The wet treatment operation may be performed using at least one of H$_2$SO$_4$, HNO$_3$, HCl, H$_2$O$_2$, H$_5$IO$_6$, Standard Clean-1 (SC-1), and Standard Clean-2 (SC-2), but the present invention is not restricted to these materials. SC-1 may be NH$_4$OH/H$_2$O$_2$, and SC-2 may be HCl/H$_2$O$_2$.

The wet treatment operation may be performed on both a conductive wafer and a plurality of insulating wafers, on the conductive wafer only, or on the insulating wafers only. As a result of the wet treatment operation, the bonding surfaces of the conductive wafer and the insulating wafers are activated.

Alternatively, a plasma treatment operation and the wet treatment operation may both be performed in order to activate the bonding surfaces of the conductive wafer and the insulating wafers.

Figure 8:
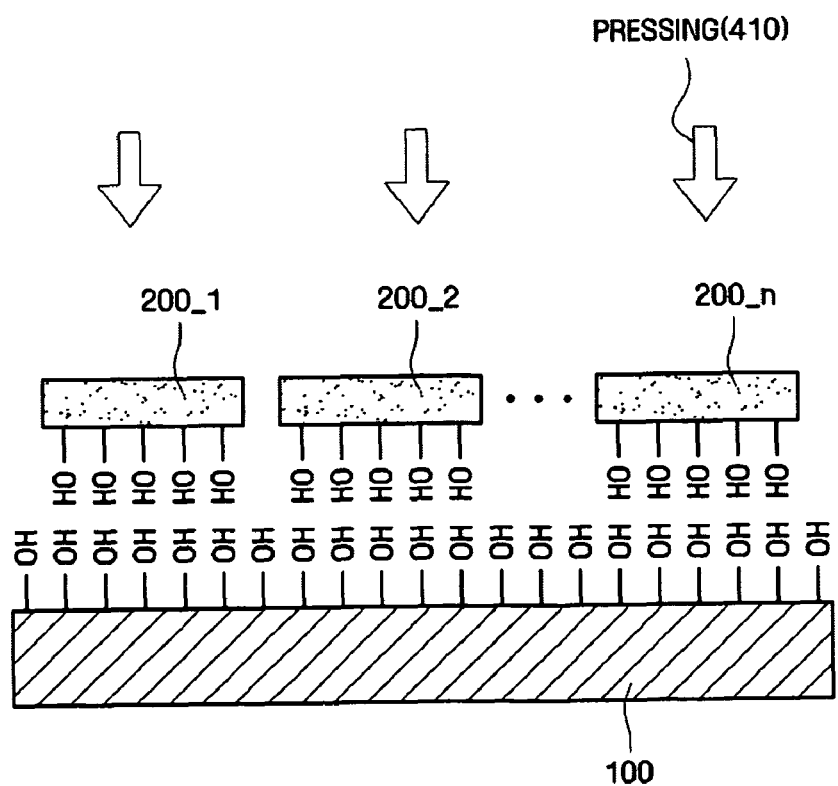
FIG. 8 illustrates a cross-sectional view for explaining a wafer bonding method according to another exemplary embodiment of the present invention.

FIG. 8 illustrates a cross-sectional view for explaining a wafer bonding method according to another exemplary embodiment of the present invention. In the wafer bonding method shown in FIG. 8, unlike in the wafer bonding method shown in FIG. 7, a plurality of insulating wafers 200_1 through 200_n are physically pressed down on a conductive wafer 100 after being laid over the conductive wafer 100 so that the bonding surfaces of the insulating wafers 200_1 through 200_n face the bonding surface of the conductive wafer 100. For example, the insulating wafers 200_1 through 200_n may be pressed down on the conductive wafer 100 at a temperature of about 25-400° C. and with a pressure of about 1-100 MPa, as indicated by reference numeral 410.

Figure 9:
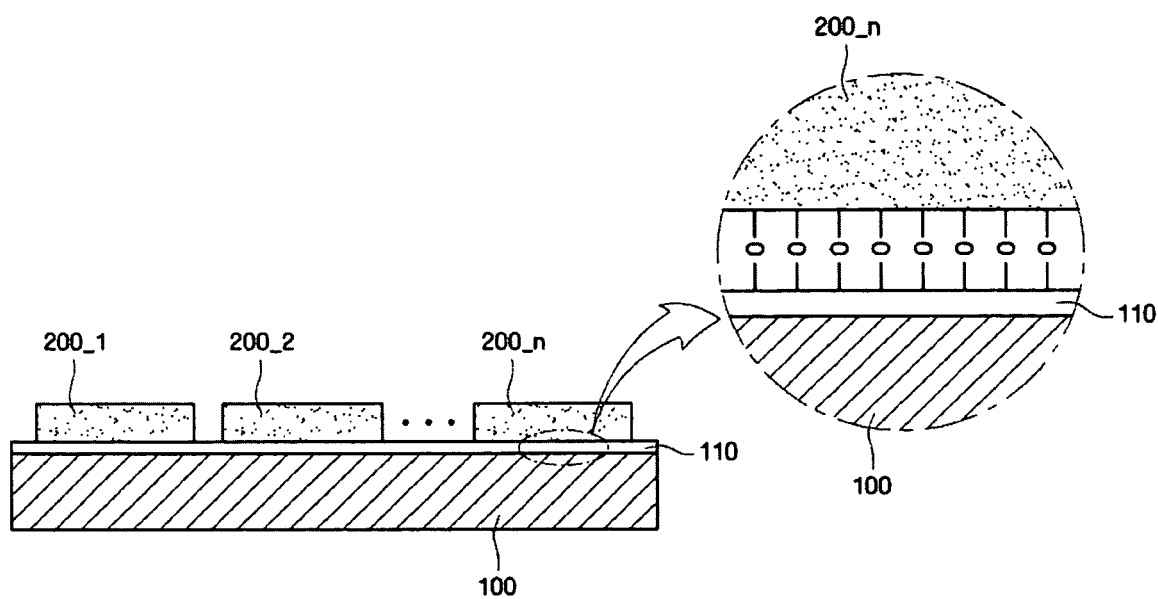
FIG. 9 illustrates a cross-sectional view for explaining a wafer bonding method according to another exemplary embodiment of the present invention.

FIG. 9 illustrates a cross-sectional view for explaining a wafer bonding method according to another exemplary embodiment of the present invention. In the wafer bonding method shown in FIG. 9, unlike in the wafer bonding method shown in FIG. 1, an insulating layer 110 is formed between the bonding surface of a conductive wafer 100 and the bonding surfaces of a plurality of insulating wafers 200_1 through 200_n.

The insulating layer 110 is illustrated in FIG. 9 as being formed on the bonding surface of the conductive wafer 110, but the present invention is not so restricted. That is, the insulating layer 110 may be formed on the bonding surfaces of the insulating wafers 200_1 through 200_n, or the insulating layer 110 may be formed not only on the bonding surface of the conductive wafer 100 but also on the bonding surfaces of the insulating wafers 200_1 through 200__n_.

The insulating layer 110 may be an oxide layer.

Since, in some embodiments, the insulating layer 110 supplies oxygen, the conductive wafer 100 may be firmly coupled to the insulating wafers 200_1 through 200__n_ through, for example, oxygen covalent bonding, due to the insulating layer 110.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A wafer bonding method comprising:
providing a conductive wafer and a plurality of insulating wafers, the conductive wafer being larger than the insulating wafers;
performing a plasma treatment operation on the conductive wafer, the insulating wafers, or both; and
directly bonding the insulating wafers to the conductive wafer.

2. The wafer bonding method of claim 1, further comprising performing or a wet treatment operation on the conductive wafer, the insulating wafers, or both.

3. The wafer bonding method of claim 1, wherein the performing the plasma treatment operation comprises using at least one of $O_2$, $NH_3$, $SF_6$, Ar, $Cl_2$, $CHF_3$, and $H_2O$.

4. The wafer bonding method of claim 1, wherein, as a result of the plasma treatment operation, dangling bonds are formed on a bonding surface of the conductive wafer, bonding surfaces of the insulating wafers, or both.

5. The wafer bonding method of claim 4, wherein the dangling bonds comprise hydrophilic dangling bonds or hydrophobic dangling bonds.

6. The wafer bonding method of claim 1, wherein the directly bonding the insulating wafers to the conductive wafer comprises laying the insulating wafers over the conductive wafer and either performing a thermal treatment operation on the conductive wafer and the insulating wafers or physically pressing the insulating wafers to the conductive wafer.

7. The wafer bonding method of claim 1, wherein the bonding surfaces of the conductive wafer and the insulating wafers are all flat.

8. The wafer bonding method of claim 1, further comprising forming an insulating layer on a bonding surface of the conductive wafer, bonding surfaces of the insulating wafers, or both.

9. The wafer bonding method of claim 1, further comprising polishing the bonding surface of the conductive wafer, the bonding surfaces of the insulating wafers, or both.

10. The wafer bonding method of claim 1, further comprising washing the conductive wafer and the insulating wafers before the performing the plasma treatment operation.

11. The wafer bonding method of claim 2, wherein performing the wet treatment operation comprises using at least one of $H_2SO_4$, $HNO_3$, HCl, $H_2O_2$, $H_5IO_6$, Standard Clean-1 (SC-1), and Standard Clean-2 (SC-2).

* * * * *